United States Patent [19]

Knierim

[11] Patent Number: 4,586,025
[45] Date of Patent: Apr. 29, 1986

[54] ERROR TOLERANT THERMOMETER-TO-BINARY ENCODER

[75] Inventor: Daniel G. Knierim, Beaverton, Oreg.
[73] Assignee: Tektronix, Inc., Beaverton, Oreg.
[21] Appl. No.: 784,415
[22] Filed: Oct. 4, 1985
[51] Int. Cl.[4] .............................................. H03M 7/00
[52] U.S. Cl. ........................ 340/347 DD; 340/347 AD
[58] Field of Search .................. 340/347 AD, 347 DD

[56] References Cited

U.S. PATENT DOCUMENTS 3,806,915  4/1974  Higgins ........................ 340/347 AD
4,069,479  1/1978  Carpenter ..................... 340/347 AD

OTHER PUBLICATIONS

Claasen "Philips Res. Repts," 30 1975 p. 73–84.

Primary Examiner—Charles D. Miller
Attorney, Agent, or Firm—Daniel J. Bedell

[57] ABSTRACT

A thermometer-to-binary encoder converts a quantity I of input digital signals, each representing one bit of an I-bit thermometer code, into a set of output digital signals each representing one bit of a corresponding binary code. The input signals are grouped into a quantity J of signal subsets, the Nth signal subset comprising the input signals representing the Nth lowest order bit of the input thermometer code and every Jth bit thereafter, each subset thereby representing a separate thermometer code derived from the I-bit input thermometer code. Each signal subset is applied as an input to a separate thermometer-to-binary encoder stage which converts the signal subset thermometer code input into a corresponding binary code output. The binary code outputs of every encoder stage are then summed to produce the set of output signals representing the binary output code corresponding to the I-bit input thermometer code.

5 Claims, 2 Drawing Figures

ERROR TOLERANT THERMOMETER-TO-BINARY ENCODER

BACKGROUND OF THE INVENTION

The present invention relates generally to thermometer-to-binary encoding systems and in particular to a thermometer-to-binary encoding system which minimizes the error in an output binary code resulting from an out-of-sequence error in an input thermometer code.

A number may be represented by a thermometer code wherein successive bits of a data word are assigned progressively larger values, all of the bits having assigned values below or the same as the number being set to a logical true state, and all of the bits having values higher than the number being set to a logical false state. In a typical analog-to-digital (A/D) converter, a reference voltage is divided into a set of progressively smaller reference voltage quantum levels and a comparator associated with each quantum level compares an analog input voltage with the voltage quantum, generating an output true state if the input voltage is higher than the voltage quantum reference. The outputs of all of the comparators thus form the bits of a thermometer code representing the magnitude of the input voltage when arranged in order of the associated reference voltage quantum level magnitudes.

In comparison to most other commonly used codes, thermometer codes do not represent numbers efficiently in terms of the number of bits required. For instance, an eight bit thermometer code can represent any one of 9 different numbers (including 0) while a typical eight bit binary code can represent 256 different numbers. Therefore the thermometer code output of an A/D converter is usually converted by an encoding circuit to another more compact and useful binary code before being transmitted as data to external circuits.

A problem arises when the bits of the thermometer code are out-of-sequence, i.e., when logical-true bits in the code are separated by one or more intervening logical-false bits. This can sometimes happen when the thermometer code is produced by an A/D converter when sampling a high frequency signal if the individual comparators of the converter do not all switch at the same speed. For instance, if the input voltage is falling at the time it is sampled, a lower order comparator which is relatively fast may switch to a low output state before a higher order comparator, which is relatively slower, switches. When the out-of-sequence thermometer code is applied as an input to a typical thermometer-to-binary encoder, the output of the thermometer-to-binary encoder bears little relation to the actual magnitude of the sampled voltage. It has been shown experimentally that for many A/D converters a good approximation of the most likely particular magnitude of a sampled voltage which produces an out-of-sequence thermometer code is obtained by simply counting the logical-true bits in the out-of-sequence thermometer code. It would be advantageous if the thermometer-to-binary encoder would produce a binary code output in response to an out-of-sequence thermometer code input which would be as close as possible to this "ideal" approximation result. It should be noted that the technique of counting the logical-true bits also correctly encodes an in-sequence thermometer code input.

SUMMARY OF THE INVENTION

According to one aspect of the present invention, in a thermometer-to-binary encoder, an I-bit thermometer code is converted to a set of J binary codes by a plurality of K-bit thermometer-to-binary encoder stages where J equals I/K. The Nth bit of the I-bit thermometer code is applied as an input to the (N modulo J)th encoder such that every encoder has as its input a K-bit thermometer code comprising every Jth bit of the I-bit thermometer code. The binary codes produced by the encoder stages are then summed to produce a binary code which is equivalent to the I-bit thermometer code. For instance a 64-bit thermometer code is divided into a set of four 16-bit thermometer codes. The first 16-bit thermometer code comprises the first, fifth, ninth, etc. bits of the 64-bit code, the second 16-bit thermometer code comprises the second, sixth, tenth, etc. bits of the 64-bit thermometer code, the third 16-bit code comprises the third, seventh, eleventh, etc. bits of the 64-bit code, and the fourth 16-bit thermometer code comprises the the fourth, eighth, twelfth, etc. bits of the 64-bit thermometer code. The four 16-bit thermometer codes are then applied as inputs to four 16-bit thermometer-to-binary encoder stages. The four 5-bit binary codes produced by the encoder stages are summed to produce a single 7-bit binary code output representing the same number as did the 64-bit thermometer code input. (A 64-bit thermometer code can represent 65 different numbers, so a 7-bit binary code is needed to encode the same values.)

The "span" of an out-of-sequence error in a thermometer code is defined as the number of intervening bits between the highest order true bit and the highest order in-sequence true bit. (An insequence true bit is defined to be a true bit for which every lower-order bit is also true.) If the span of an out-of-sequence error in a thermometer code is less than J, the binary code output of the thermometer-to-binary encoder of the present invention will represent the count of the bits of the thermometer code in the true state, i.e., it will match the ideal approximation result. If the span of the error is equal to or greater than J, the binary code output will deviate from the ideal approximation result by an amount which is substantially less than the amount of deviation exhibited by thermometer-to-binary encoders of the prior art.

It is accordingly an object of the present invention to provide a new and improved thermometer-to-binary encoder which minimizes the deviation of the magnitude of its binary code output from the ideal approximation magnitude resulting from an out-of-sequence error in its thermometer code input.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of an analog-to-binary converter of the prior art; and FIG. 2 is a block diagram of a thermometer-to-binary converter according to the present invention.

DETAILED DESCRIPTION

A number may be represented by a thermometer code wherein each successive bit of a data word is assigned a progressively larger value, all of the bits having assigned values below or the same as the number being set to a logical true (e.g. a logic "1" level) state and all of the bits having values above the number being set to a logical false (e.g. a logic "0" level) state. Table I lists the decimal values associated with each allowable state of an eight bit thermometer code.

TABLE I

| 0 | 00000000 | 5 | 00011111 |
|---|---|---|---|
| 1 | 00000001 | 6 | 00111111 |
| 2 | 00000011 | 7 | 01111111 |
| 3 | 00000111 | 8 | 11111111 |
| 4 | 00001111 | | |

A 16-bit thermometer code would be required to represent the numbers from 0 to 16. Binary codes are more compact; only 5-bits are required to represent the numbers from 0 to 16. Table II lists the decimal values of the first 17 combinations of the standardly weighted 5-bit binary code.

TABLE II

| DEC | BINARY | DEC | BINARY |
|---|---|---|---|
| 0 | 00000 | 8 | 01000 |
| 1 | 00001 | 9 | 01001 |
| 2 | 00010 | 10 | 01010 |
| 3 | 00011 | 11 | 01011 |
| 4 | 00100 | 12 | 01100 |
| 5 | 00101 | 13 | 01101 |
| 6 | 00110 | 14 | 01110 |
| 7 | 00111 | 15 | 01111 |
| | | 16 | 10000 |

Figure 1:
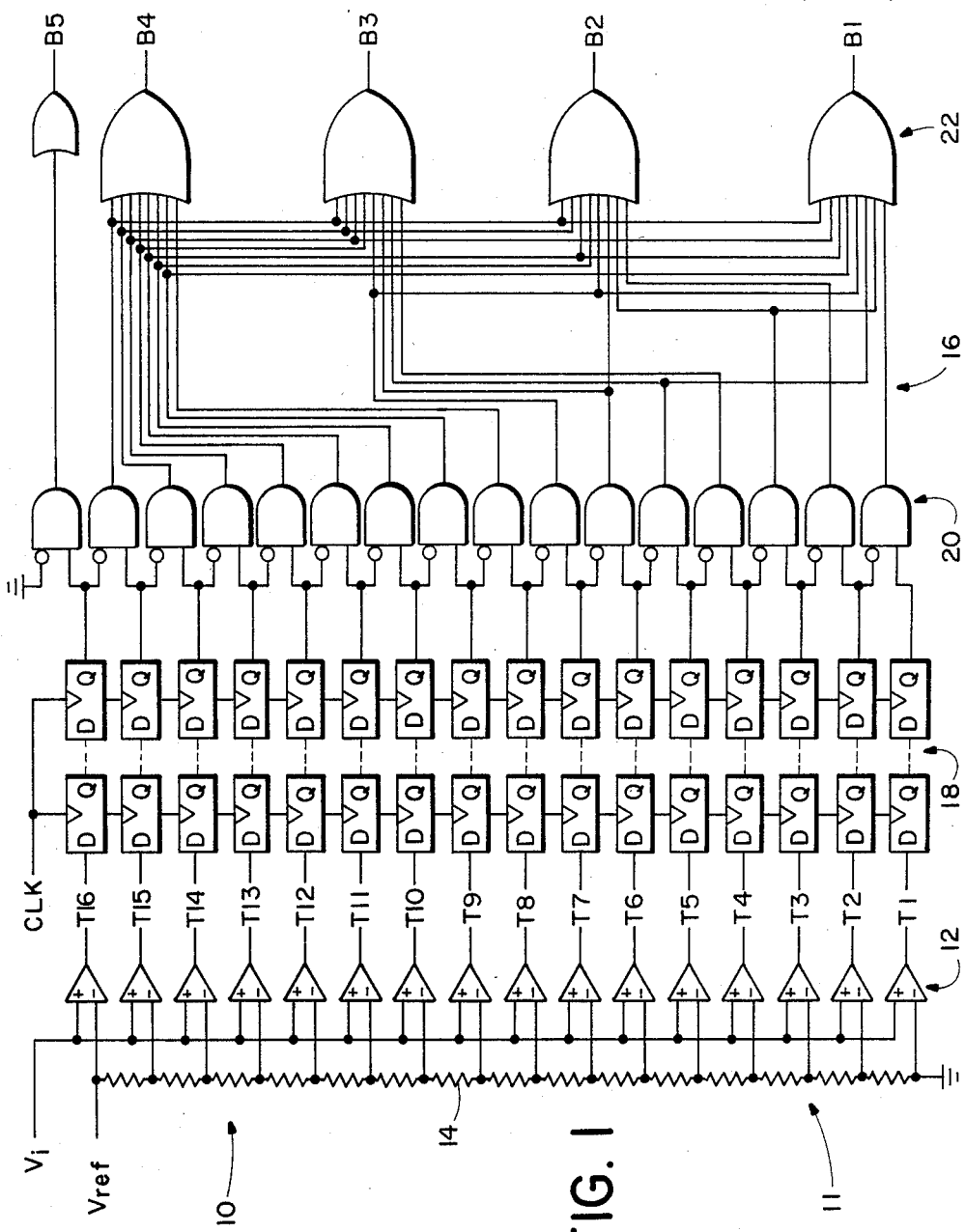

Referring to FIG. 1, there is depicted in block diagram form, an analog-to-binary converter 10 of the prior art adapted to convert an analog voltage signal Vi to a five-bit binary code signal of equivalent magnitude. The converter 10 comprises an analog-to-thermometer code converter 11, a thermometer-to-binary encoder 16, and a set of latch pipelines 18 coupling the output of the code converter 11 to the input of the encoder 16. The analog-to-thermometer code conversion circuit 11 comprises a set of sixteen comparators 12 and a voltage divider network 14. The analog voltage signal Vi is applied to a non-inverting input of each of the comparators 12 while a reference voltage Vref is applied to one end of the voltage divider network 14, the other end being grounded, thereby producing a series of progressively lower reference voltage quantum levels each of which is applied to an inverting input of a corresponding comparator 12. Each comparator 12 includes a difference amplifier having an output which saturates to a high (1) logic level output state if the input voltage is sufficiently higher than its voltage reference level or saturates to a low (0) logic level output state if the input voltage is sufficiently lower than its reference voltage. For instance, if the input voltage is higher than the reference voltage applied to the 5th comparator (i.e., the comparator producing the 5th lowest order thermometer code bit T5) but lower than the voltage applied to the 6th comparator, the outputs of the 1st through the 5th comparators (T1–T5) will all be high while the outputs of the 6th through the 16th comparator (T6–T16) will all be low. The outputs (T1 through T16) of all of the comparators 12 thus collectively appear as a 16-bit thermometer code representing the magnitude of the input voltage Vi as any one of seventeen discrete numbers from 0 to 16 inclusive.

The thermometer code output of the converter circuit 11 is latched onto the input of the encoding circuit 16 on receipt of a series of clock (CLK) signals by the latches of latch pipelines 18. The encoding circuit 16, which converts the thermometer code to a more compact and useful 5-bit binary code, comprises a set of AND gates 20 and a set of OR gates 22, one such AND gate corresponding to each thermometer code input bit and one such OR gate corresponding to each binary code output bit. Each thermometer code bit output of a corresponding latch pipeline 18 is applied to a non-inverting input of the corresponding AND gate 20 and to an inverting input of the AND gate 20 associated with the next lower order thermometer code bit, if any. The inverting input of the AND gate associated with the highest thermometer code bit T16 is grounded. The outputs of the sixteen AND gates 20 are connected to inputs of the OR gates 22 such that the output of one OR gate 22 comprises the first (rightmost) bit B1 of the binary code corresponding to the thermometer code appearing at the conversion circuit input, while the outputs of the other OR gates comprise the second through the fifth bits B2–B5 of the binary code. More specifically, the AND gates 20 and OR gates 22 are interconnected to effect the following Boolean relations between the bits of the thermometer and binary codes, where the "*" symbol represents an AND function, the "+" symbol represents an OR function, and the "/" symbol preceding a bit reference character indicates a NOT function:

B1 = (T1*/T2) + (T3*/T4) + (T5*/T6) + (T7*/T8) + (T9*/T10) + (T11*/T12) + (T13*/T14) + (T15*/T16)
B2 = (T2*/T3) + (T3*/T4) + (T6*/T7) + (T7*/T8) + (T10*/T11) + (T11*/T12) + (T14*/T15) + (T15*/T16)
B3 = (T4*/T5) + (T5*/T6) + (T6*/T7) + (T7*/T8) + (T12*/T13) + (T13*/T14) + (T14*/T15) + (T15*/T16)
B4 = (T8*/T9) + (T9*/T10) + (T10*/T11) + (T11*/T12) + (T12*/T13) + (T13*/T14) + (T14*/T15) + (T15*/T16)
B5 = T16

If the analog input voltage Vi is insufficiently larger or smaller than the quantum reference voltage applied to any one of the comparators 12, the comparator output will be at an invalid logic level, neither logically high nor low, but at an intermediate level wherein minor variations of the input or reference voltages may swing the comparator output to either its high or low level output state. Also, if the analog input voltage is slewing past the reference quantum levels at a rate faster than the response time of the comparators, one or more comparators outputs may be simultaneously in an intermediate invalid state at the times they are latched by the first latches in latch pipelines 18. Latch pipelines 18 are provided to stabilize any invalid thermometer code bit before applying the bit to the logic gate portion of encoder 16. Each pipeline latch is of the type having a positive feedback circuit such that the output will be driven toward its high logic level state if its input voltage is slightly larger than a threshold voltage, and will be driven toward its low logic level state if its input voltage is slightly smaller than the threshold voltage. After passing through a succession of such latches in a pipeline, the probability that a thermometer code bit generated by a comparator 12 will be stabilized to a 0 or 1 logic level as it reaches the input to the encoder 16 is very high.

While latch pipelines 18 stabilize the individual converter 11 output bits, they do not prevent out-of-sequence errors in the thermometer code applied to the encoder 16 input. In an out-of-sequence error, one or more lower order bits of the thermometer code are in a 0 state while one or more higher order bits are in a 1 state. For example, the 8-bit 00100111 thermometer code contains an out-of-sequence error. The higher order bit in the sixth position from the right is in the 1 state while two lower order bits bit in the 4th and 5th positions from the right are in the 0 state. This type of error can occur in an analog-to-thermometer code converter 11 when the frequency of the analog input signal Vi is high and the switching speeds of comparators 12 or the thresholds of latches 18 are not suitably matched. When Vi changes rapidly from a high to a low value, the output of a lower order, relatively fast, comparator 12 may drop below the threshold of the first latch of its corresponding latch pipeline 18 before the output of a higher order, relatively slower, converter drops below the threshold of its corresponding pipeline's first latch. If the CLK signal clocks the latches 18 after the output of a lower order comparator 12 drops below its corresponding latch input 18 threshold, but before the output of the higher order converter drops below its corresponding latch input, an out-of-sequence error results. An out-of-sequence error can also occur when the input signal Vi rapidly increases.

A thermometer code containing an out-of-sequence error is passed on to the input of the thermometer-to-binary code converter 16 and the resulting binary code output of the converter bears little relation to the actual sample voltage Vi magnitude at the moment of sampling. The actual magnitude of the voltage Vi is likely to be between the value of the highest order in-sequence bit in a 1 state and the highest order out-of-sequence bit in a 1 state. For instance, the magnitude of the voltage Vi which produced an out-of-sequence thermometer code 0000000010001111 is most likely to be between 4 and 8. For many A/D converters of the type shown in FIG. 1, an "ideal" approximation of the particular magnitude of a sampled voltage producing a out-of-sequence error is obtained by simply counting the bits in the 1 state in the out-of-sequence thermometer code. According to this ideal approximation, the magnitude of Vi which would produce the example out-of-sequence thermometer code is most likely to be 5 since there are five logic level 1 bits in the code. However, if such an out-of-sequence thermometer code were applied to the thermometer-to-binary encoder 16 of FIG. 1, the resulting 5-bit binary code output would be 01100, a decimal 12, for a deviation from the ideal approximation of 7.

The deviation of the output of the encoder circuit 16 of FIG. 1 from the ideal approximation will always be positive and can be much larger. For instance, if the out-of-sequence thermometer code were 1011111111111111, the resulting binary code would be 11110 (decimal 30) when the ideal binary output code should be 01111 (decimal 15), a deviation from ideal of 15.

An improved version of the thermometer-to-binary encoder 16, still within the realm of prior art, can be constructed by rearranging the connections of the outputs of the AND gates 20 and the inputs of the OR gates 22 in such a fashion as to make the outputs of the OR gates form a Gray-code equivalent in value to the thermometer code input. This encoder can then be fed through a Gray-to-binary encoder to complete the thermometer to binary conversion. The designs of such binary-to-Gray and Gray-to-binary encoders are well known in the art and are also discussed in copending U.S. patent application No. 784414 entitled "Thermometer-To-Adjacent Binary Encoder" filed 10/04/85 which is incorporated herein by reference. Using such a thermometer-to-Gray-to-binary encoder reduces, but does not eliminate, encoding errors resulting from out-of-sequence thermometer code inputs. The error between the thermometer-to-Gray-to-binary encoder's output and the "ideal" approximations can be shown to appear somewhat random in nature (i.e., both positive and negative) and is limited to less than three times the span of the out-of-sequence error in the thermometer code input.

Figure 2:
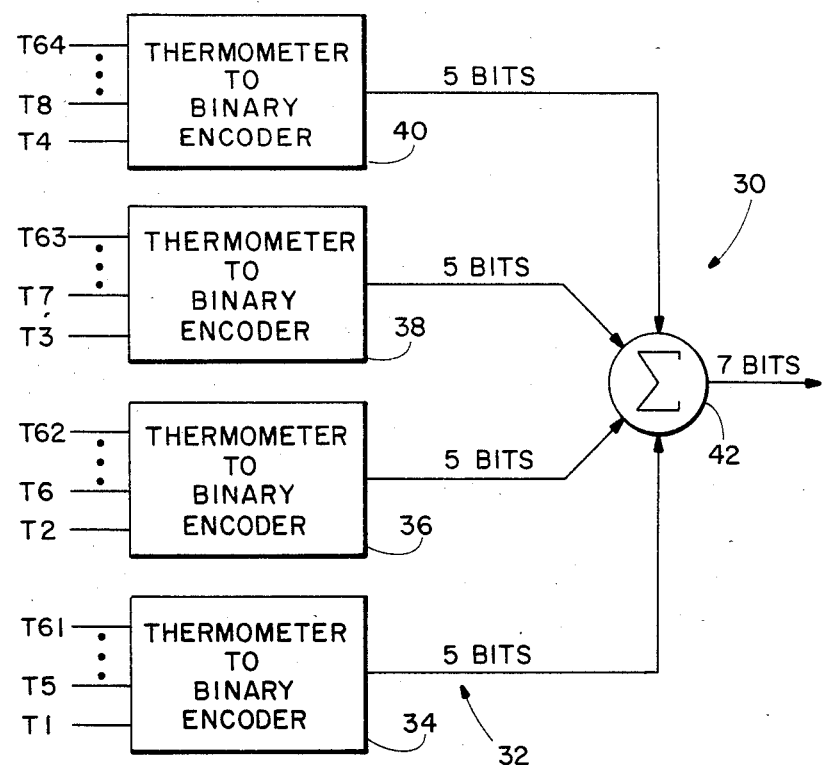

Referring to FIG. 2, an encoder 30, depicted in block diagram form, is adapted to convert a first set of I digital signals, representing an I-bit thermometer code, into a second set of digital signals representing a corresponding binary code, with the output binary code exhibiting minimal deviation from the ideal approximation result when the input thermometer code contains an out-of-sequence error. In the example of FIG. 2, the number of bits (I) of the thermometer code is 64, the bits of the code being labeled from T1 to T64 in order of their relative magnitudes, the lowest order bit being T1. The thermometer code signals are grouped into J subsets of K signals each, and each signal subset is applied as an input to a separate one of J thermometer-to-binary encoder stages 32, each comprising either a thermometer-to-binary encoder or a thermometer-to-Gray-to-binary encoder as described above. In the example of FIG. 2, the integer J is 4 and the integer K is 16 so that there are 4 encoder stages 32, each converting a 16-bit thermometer code to a 5-bit binary code. The lowest order bit T1 of the 64-bit thermometer code is applied as a lowest order bit of the 16 bit thermometer code input of a first encoder stage 34. Similarly, the next 3 lowest order bits (bits T2-T4) of the 64-bit thermometer code are applied as the lowest order input bits to the second through the fourth encoder stages 36, 38 and 40 respectively. The next set of four lowest order bits (bits 5 through 8) of the 64-bit thermometer code are applied as the next lowest order input bits of the 16-bit thermometer code input to the first through the fourth encoder stages 32, respectively. The remaining progressively higher order bits of the 64-bit thermometer code are also grouped and applied as progressively higher order input bits to the encoder stages 32 such that the Nth encoder stage, where N is an integer from 1 through J (e.g. 4), has as its input a K-bit (e.g. 16-bit) thermometer code, comprising the Nth lowest order bit of the I-bit (e.g. 64-bit) thermometer code and every Jth (4th) bit thereafter in ascending order.

In the embodiment of the invention depicted in FIG. 2, each encoder stage 32 has a five-bit binary output code similar to that of Table II above. The five-bit binary code output of each encoder stage is applied as an input to a summer 42 which generates as its output a seven-bit binary code representing the sum of the binary code outputs of encoders 32, which sum can range from 0 to 64. Circuits capable of performing the function of summer 42 are well known in the art and are not further detailed herein.

Assuming by way of example that a 64-bit thermometer code input to encoding circuit 30 represented the decimal number 21, the 21 lowest order bits of the code would be high and the 43 higher order bits would be low. The 16-bit thermometer code input to the first encoder stage 34 would be 0000000000111111 (a decimal 6), and the thermometer code inputs to the second, third and fourth encoder stages 36, 38, and 40 would all be 0000000000011111 (a decimal 5). The first encoder stage 34 would then convert its thermometer code input to a binary equivalent of decimal 6 while the other encoder stages would convert their thermometer code inputs to the binary equivalent of decimal 5. Summer 42 would then sum the four encoder stage 32 outputs to produce the 7-bit binary equivalent of decimal 21, 0010101.

By grouping the bits of the I-bit thermometer code into subsets, separately encoding each subset, and summing the binary code output of each encoder stage 32 as described hereinabove, the deviation of the sum from the ideal approximation of an out-of-sequence thermometer code is reduced over that which would typically be produced by a single stage 64-bit thermometer-to-Gray-to-binary or thermometer-to-binary code converter. For instance, if the 64-bit thermometer code input was 00...001000111111111111, the thermometer code inputs to the first, second and third encoder stages 32 would all be 00...00111 (a decimal 3), while the input to the fourth encoder stage would be 00...001111 (a decimal 4). As can be seen, none of these thermometer code subsets contain an out-of-sequence error. The output of the summer 42 would be the binary equivalent of a decimal 13 which is the ideal approximation corresponding to the out-of-sequence thermometer code since there are thirteen logic level 1 bits in the thermometer code. If such an out-of-sequence thermometer code were applied to a single stage 64-bit thermometer-to-binary encoder, similar in design to the encoder of FIG. 1 but having 64 rather than 16 inputs, the output of the encoder would be 00111000 (a decimal 28), a deviation of 15 from the ideal approximation.

Similarly, if such an out-of-sequence thermometer code were applied to a 64-bit thermometer-to-Gray-to-binary encoder, the output of the encoder would 0010011 (a decimal 19), a deviation of 6 from the ideal approximation.

The span of the out-of-sequence error in the thermometer code 00...001000111111111111, i.e., the number of intervening bits between the highest order 1 bit and the highest order in-sequence 1 bit in the thermometer code, is 3. Whenever the span of an out-of-sequence error is less than the number (J) of encoder stages 32, the input to each encoder stage 32 will be free of out-of-sequence errors and the output of summer 42 will always equal the ideal approximation value of an out-of-sequence thermometer code input. In contrast, the output of a single stage prior art encoding system will always differ from the ideal approximation value, often by a substantial amount as illustrated hereinabove.

When the span of an out-of-sequence error is greater than or equal to J, one or more of the thermometer code inputs to encoder stages 32 may also contain an out-of-sequence error. However the span of the error in the K-bit thermometer code input to any one encoder stage 32 will be smaller than the span in the error in the I-bit thermometer code. In fact, the spans of the out-of-sequence errors in the K-bit thermometer codes will be at most the span of the error in the I-bit thermometer code divided by J.

Use of thermometer-to-Gray-to-binary encoders provides an advantage over use of direct thermometer-to-binary encoders as encoders 32 of FIG. 2. Since the errors in the outputs of the thermometer-to-Gray-to-binary encoders resulting from an out-of-sequence input thermometer code tend to be randomly distributed, the errors will tend to cancel one another when the encoder stage outputs are summed. The difference between the ideal approximation value of an out-of-sequence thermometer code and the output of the summer 42 is on the average reduced by a factor of the square root of J over the difference between the ideal and the actual output of a single stage encoder circuit of the prior art. Thus if J is 4, and the out-of-sequence span is larger than or equal to 4, the use of thermometer-to-Gray-to-binary encoders in the circuit of FIG. 2 will produce an output which on the average deviates from the ideal approximation by roughly half the amount by which the output of a 64-bit, single stage thermometer-to-binary encoder circuit deviates from the ideal approximation.

While a preferred embodiment of the present invention has been shown and described, it will be apparent to those skilled in the art that many changes and modifications may be made without departing from the invention in its broader aspects. For example, while the invention as illustrated in FIG. 2 converts a 64-bit thermometer code to a binary code utilizing four encoder stages 32, other thermometer code sizes (I) and/or other numbers (J) of encoder stages may be utilized in a similar fashion according to the present invention. Also, while the invention was described as having encoder stages 32 comprising thermometer-to-Gray-to-binary encoders or thermometer-to-binary encoders of the type illustrated in FIG. 1, other thermometer-to-binary encoders may be used and are particularly advantageous if their out-of-sequence output errors are limited and tend to cancel one another. As an example, if half of the encoders 32 are thermometer-to-binary encoders as in FIG. 1 and the other half are similarly constructed but using inverted logic whereby the errors from the first half will always be positive and the errors from the second half will always be negative, the errors will tend to cancel. The claims are therefore intended to cover all such changes and modifications as fall within the true spirit and scope of the invention.

I claim:
1. A method for producing a binary code corresponding to a first thermometer code, each bit of said first thermometer code being represented by the state of a separate one of a set of digital signals, the method comprising the steps of:
   grouping said signals into selected subsets each representing a further thermometer code;
   converting each said signal subset thermometer code into a corresponding binary code; and
   summing the binary codes representing each signal subset to produce the binary code corresponding to said first thermometer code.
2. The method according to claim 1 wherein digital signals as grouped into a selected subset represent bits spaced in said first thermometer code by a predetermined interval.
3. A method for converting a first set of I digital electronic signals representing an I-bit thermometer code into a second set of digital electronic signals repre- senting a corresponding binary code, wherein I is a selected integer, the method comprising the steps of:

a. grouping said first signal set into a plurality, J, of first signal subsets, each Nth first signal subset comprising the Nth signal of said first signal set and every Jth signal thereafter, each first signal subset thereby representing a separate thermometer code;

b. converting each said first signal subset into a corresponding third digital electronic signal subset representing a binary code corresponding to the thermometer code represented by a said first signal subset; and c. summing all third digital electronic signal subsets to produce said second set of digital electronic signals representing said binary code corresponding to said I-bit thermometer code.

4. The method of claim 3 wherein step b comprises the substeps of;

d. converting each said first signal subset into a corresponding Gray code, and e. converting each said Gray code into said corresponding third signal subset representing a said binary code.

5. An apparatus for converting a first set of I digital electronic signals representing an I-bit thermometer code into a second set of digital electronic signals representing a corresponding binary code, wherein I is a selected integer, the apparatus comprising;

means for grouping said first signal set into a plurality, J, of first signal subsets, each Nth first signal subset comprising the Nth signal of said first signal set and every Jth signal thereafter, each first signal subset thereby representing a separate thermometer code;

means for converting each said first signal subset into a corresponding third digital electronic signal subset representing a binary code corresponding to the thermometer code represented by a said first signal subset; and means for summing all third digital electronic signal subsets to produce said second set of digital electronic signals representing said binary code corresponding to said I-bit thermometer code.

* * * * *